US012609285B2

(12) United States Patent　　(10) Patent No.:　US 12,609,285 B2
Ikeda et al.　　(45) Date of Patent:　Apr. 21, 2026

(54) SEMICONDUCTOR MANUFACTURING APPARATUS AND MANUFACTURING METHOD FOR SEMICONDUCTOR DEVICE

(71) Applicant: Tokyo Electron Limited, Tokyo (JP)

(72) Inventors: Taro Ikeda, Yamanashi (JP); Satoru Kawakami, Yamanashi (JP); Hiroyuki Miyashita, Yamanashi (JP)

(73) Assignee: TOKYO ELECTRON LIMITED, Tokyo (JP)

( * ) Notice: Subject to any disclaimer, the term of this patent is extended or adjusted under 35 U.S.C. 154(b) by 789 days.

(21) Appl. No.: 17/891,300

(22) Filed: Aug. 19, 2022

(65) Prior Publication Data

US 2023/0054452 A1　　Feb. 23, 2023

(30) Foreign Application Priority Data

Aug. 23, 2021　(JP) ................................. 2021-135808

(51) Int. Cl.
| | |
|---|---|
| *H01J 37/32* | (2006.01) |
| *C23C 16/34* | (2006.01) |
| *C23C 16/455* | (2006.01) |
| *H01L 21/02* | (2006.01) |

(52) U.S. Cl.
CPC ...... *H01J 37/32311* (2013.01); *C23C 16/345* (2013.01); *C23C 16/45544* (2013.01); *H01J 37/32229* (2013.01); *H01J 37/32449* (2013.01); *H01J 37/32715* (2013.01); *H01L 21/0217* (2013.01); *H01L 21/02274* (2013.01); *H01L 21/0228* (2013.01); *H01J 2237/201* (2013.01); *H01J 2237/332* (2013.01)

(58) Field of Classification Search
CPC ............. H01J 37/32311; H01J 37/3229; H01J 37/32715; H01J 2237/201; H01J 2237/332–3348; C23C 16/345; C23C 16/45544; H01L 21/0217; H01L 21/02274; H01L 21/0228
See application file for complete search history.

(56) References Cited

U.S. PATENT DOCUMENTS

| | | | |
|---|---|---|---|
| 6,114,811 A * | 9/2000 | Wu ..................... | H01J 37/3222 |
| | | | 315/111.21 |
| 8,361,274 B2 * | 1/2013 | Lee ..................... | H01J 37/3244 |
| | | | 118/724 |

(Continued)

FOREIGN PATENT DOCUMENTS

| | | |
|---|---|---|
| JP | 2012199226 A | 10/2012 |
| JP | 2014-093226 A | 5/2014 |
| JP | 2017034067 A | 2/2017 |

*Primary Examiner* — Charlee J. C. Bennett
(74) *Attorney, Agent, or Firm* — Venjuris, P.C.

(57) ABSTRACT

A semiconductor manufacturing apparatus includes: a processing container that accommodates a substrate holder that holds a plurality of substrates in a shelf shape; a gas supply that supplies a processing gas into the processing container; and a microwave introducer that generates a plasma from the processing gas. The microwave introducer includes: a rectangular waveguide provided along a length direction of the processing container and including a plurality of slots that radiates microwaves; and a phase controller that is provided at an end of the rectangular waveguide and controls a phase of the microwaves propagating in the rectangular waveguide.

14 Claims, 8 Drawing Sheets

(56)　　　　　References Cited

U.S. PATENT DOCUMENTS

| | | | |
|---|---|---|---|
| 2004/0206729 A1* | 10/2004 | Shinohara | H01J 37/32192 |
| | | | 219/121.43 |
| 2005/0227500 A1* | 10/2005 | Sugawara | C23C 16/511 |
| | | | 438/785 |
| 2006/0175304 A1* | 8/2006 | Hwang | C23C 8/36 |
| | | | 219/121.43 |
| 2009/0056877 A1* | 3/2009 | Matsuura | H01J 37/321 |
| | | | 156/345.48 |
| 2011/0150719 A1* | 6/2011 | Ikeda | H01J 37/32229 |
| | | | 343/781 R |
| 2014/0123895 A1* | 5/2014 | Kato | H01J 37/321 |
| | | | 118/723 VE |
| 2014/0367377 A1* | 12/2014 | Monden | H01L 21/68742 |
| | | | 219/747 |
| 2015/0107517 A1* | 4/2015 | Hasebe | C23C 16/452 |
| | | | 118/723 R |
| 2022/0181125 A1* | 6/2022 | Takeda | H01J 37/32522 |

* cited by examiner

SEMICONDUCTOR MANUFACTURING APPARATUS AND MANUFACTURING METHOD FOR SEMICONDUCTOR DEVICE

CROSS-REFERENCE TO RELATED APPLICATIONS

This application is based on and claims priority from Japanese Patent Application No. 2021-135808 filed on Aug. 23, 2021 with the Japan Patent Office, the disclosure of which is incorporated herein in its entirety by reference.

TECHNICAL FIELD

The present disclosure relates to a semiconductor manufacturing apparatus and a manufacturing method for a semiconductor device.

BACKGROUND

A batch-type substrate processing apparatus in which an inductively coupled plasma source is mounted has been known (see, e.g., Japanese Patent Laid-Open Publication No. 2014-093226).

SUMMARY

A semiconductor manufacturing apparatus according to an aspect of the present disclosure includes: a processing container that accommodates a substrate holder that holds a plurality of substrates in a shelf shape; a gas supply unit that supplies a processing gas into the processing container; and a microwave introducing unit that generates a plasma from the processing gas. The microwave introducing unit includes: a rectangular waveguide provided along a length direction of the processing container and including a plurality of slots that radiates microwaves; and a phase controller that is provided at a terminating end of the rectangular waveguide and controls a phase of the microwaves propagating in the rectangular waveguide.

The foregoing summary is illustrative only and is not intended to be in any way limiting. In addition to the illustrative aspects, embodiments, and features described above, further aspects, embodiments, and features will become apparent by reference to the drawings and the following detailed description.

DETAILED DESCRIPTION

Figure 1:
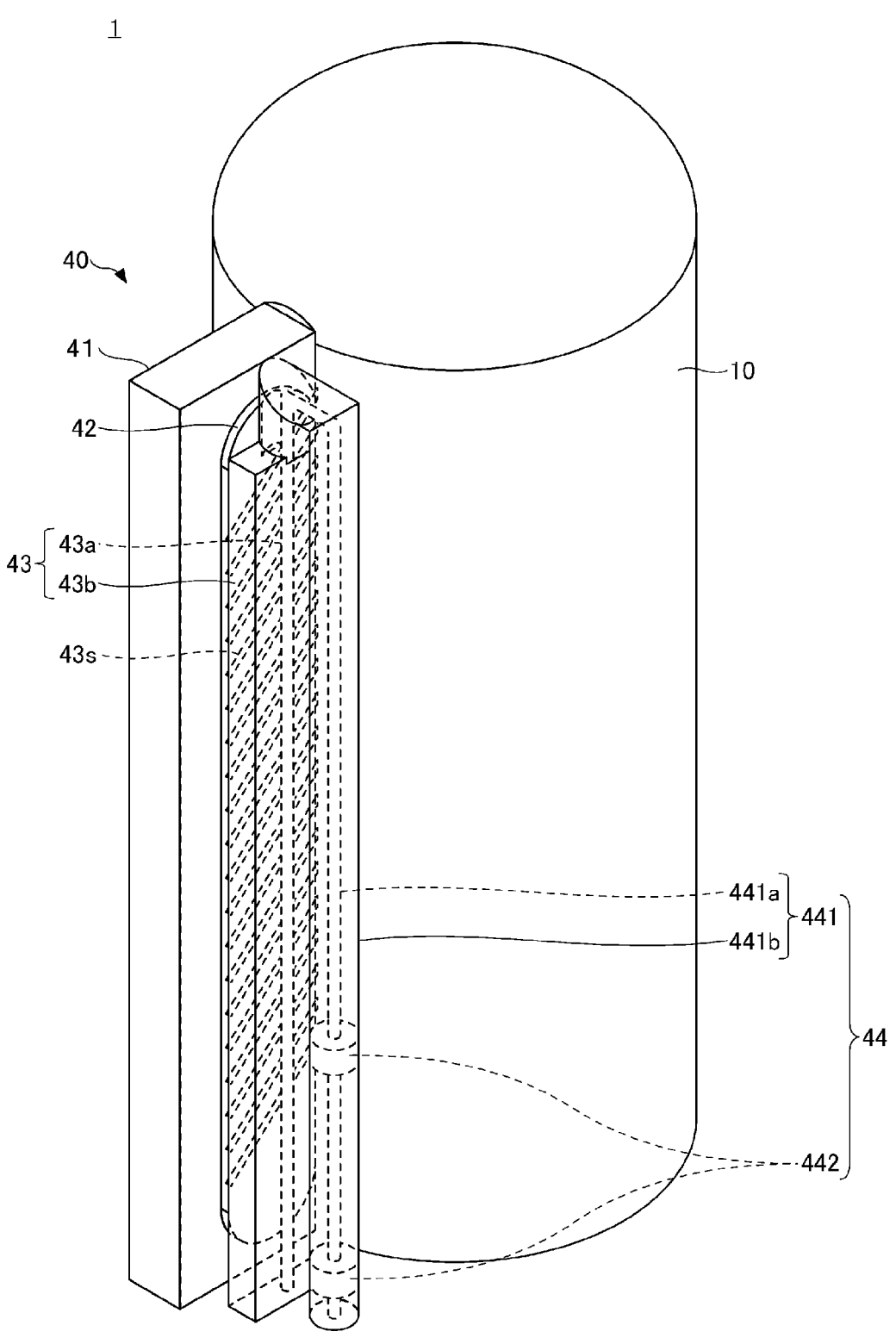
FIG. 1 is a perspective view illustrating an example of a semiconductor manufacturing apparatus according to an embodiment.

In the following detailed description, reference is made to the accompanying drawings, which form a part hereof. The illustrative embodiments described in the detailed description, drawing, and claims are not meant to be limiting. Other embodiments may be utilized, and other changes may be made without departing from the spirit or scope of the subject matter presented here.

Hereinafter, non-limiting exemplary embodiments of the present disclosure will be described with reference to the accompanying drawings. In all of the accompanying drawings, the same or corresponding members or parts are denoted by the same or corresponding reference numerals, and redundant explanations are omitted.

[Semiconductor Manufacturing Apparatus]

Figure 2:
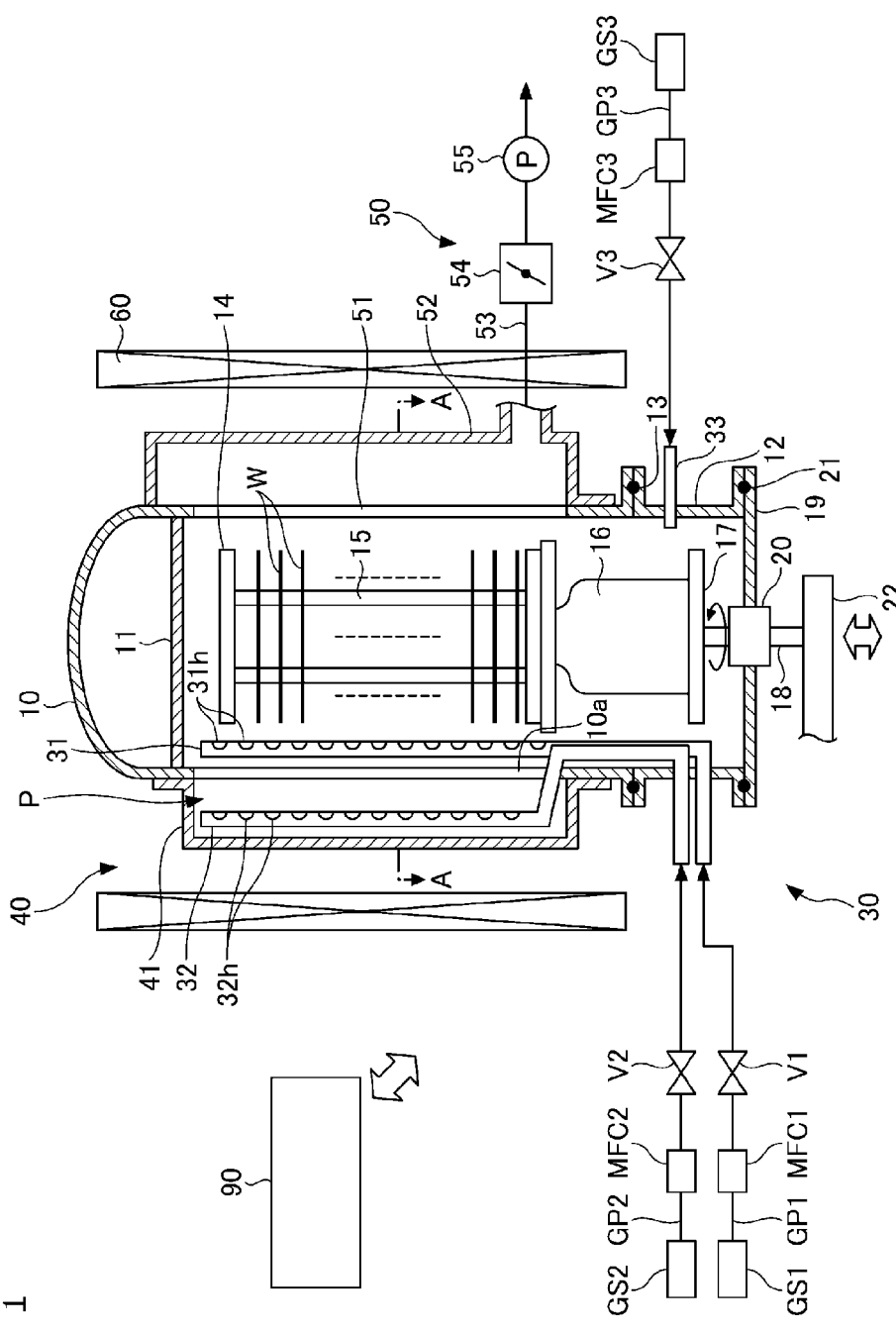
FIG. 2 is a vertical cross-sectional view illustrating the example of the semiconductor manufacturing apparatus according to the embodiment.
Figure 3:
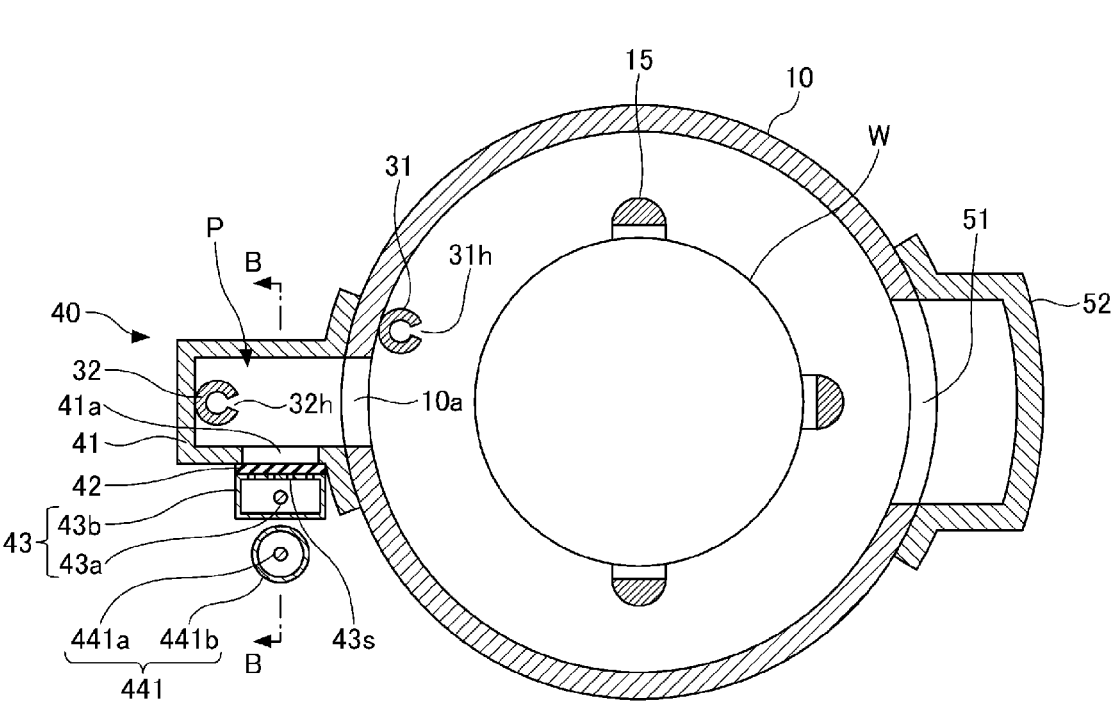
FIG. 3 is a cross-sectional view illustrating the example of the semiconductor manufacturing apparatus according to the embodiment.
Figure 4:
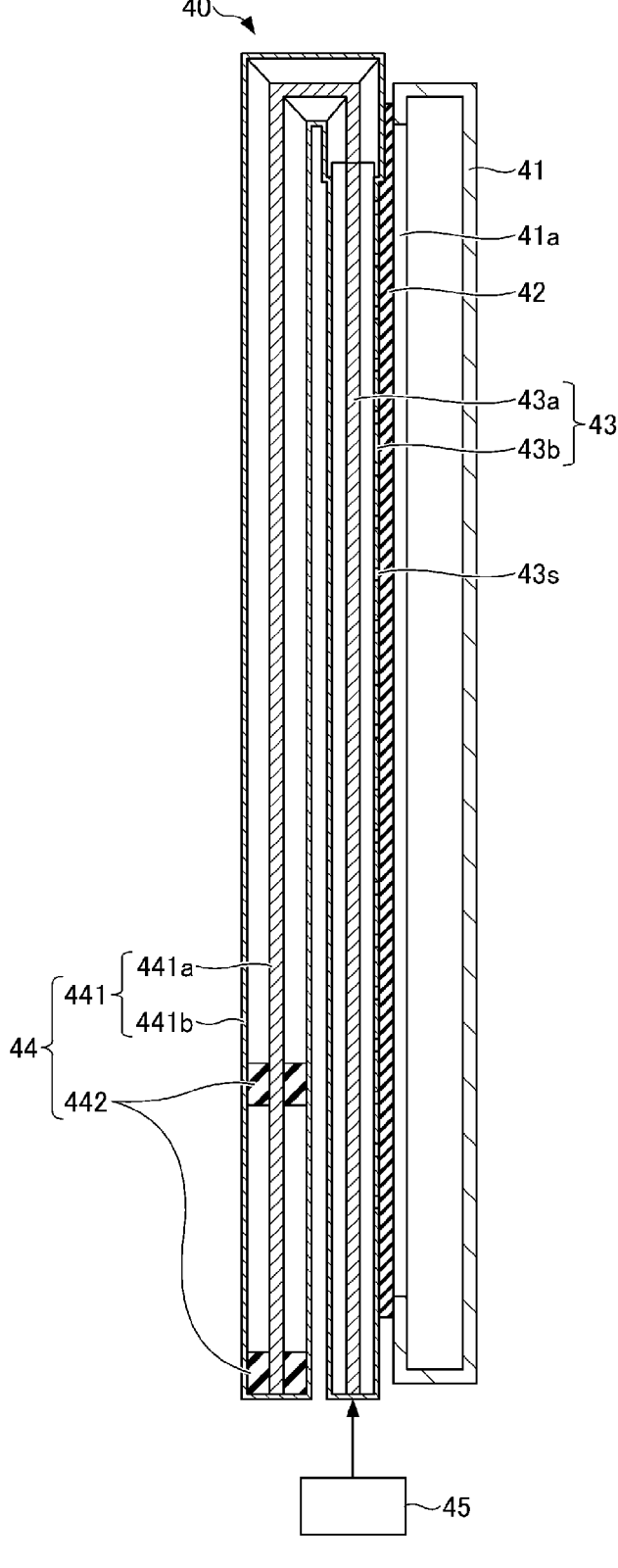
FIG. 4 is a vertical cross-sectional view illustrating an example of a microwave introducing unit.
Figure 5:
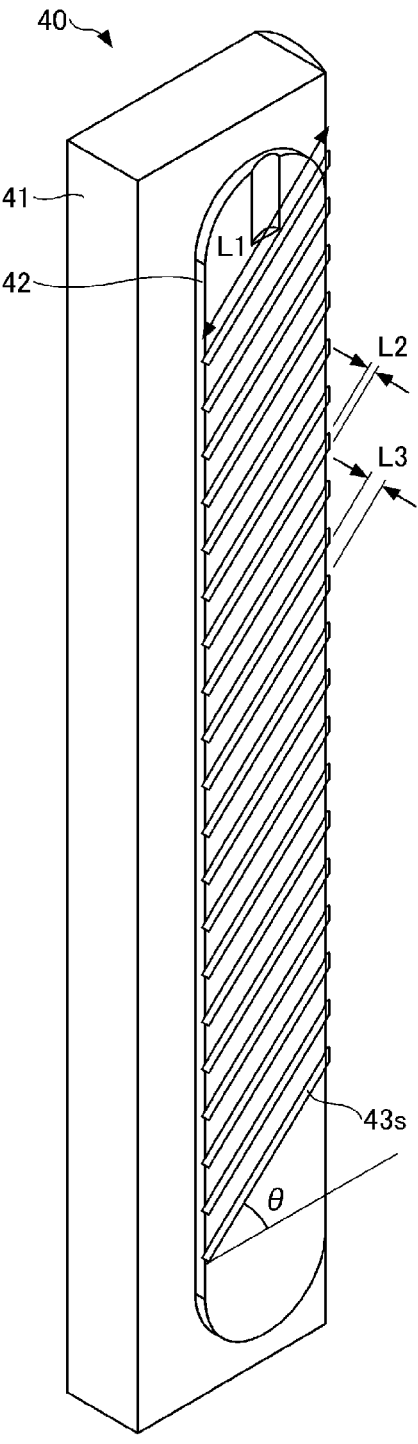
FIG. 5 is a perspective view illustrating slots.
Figure 6:
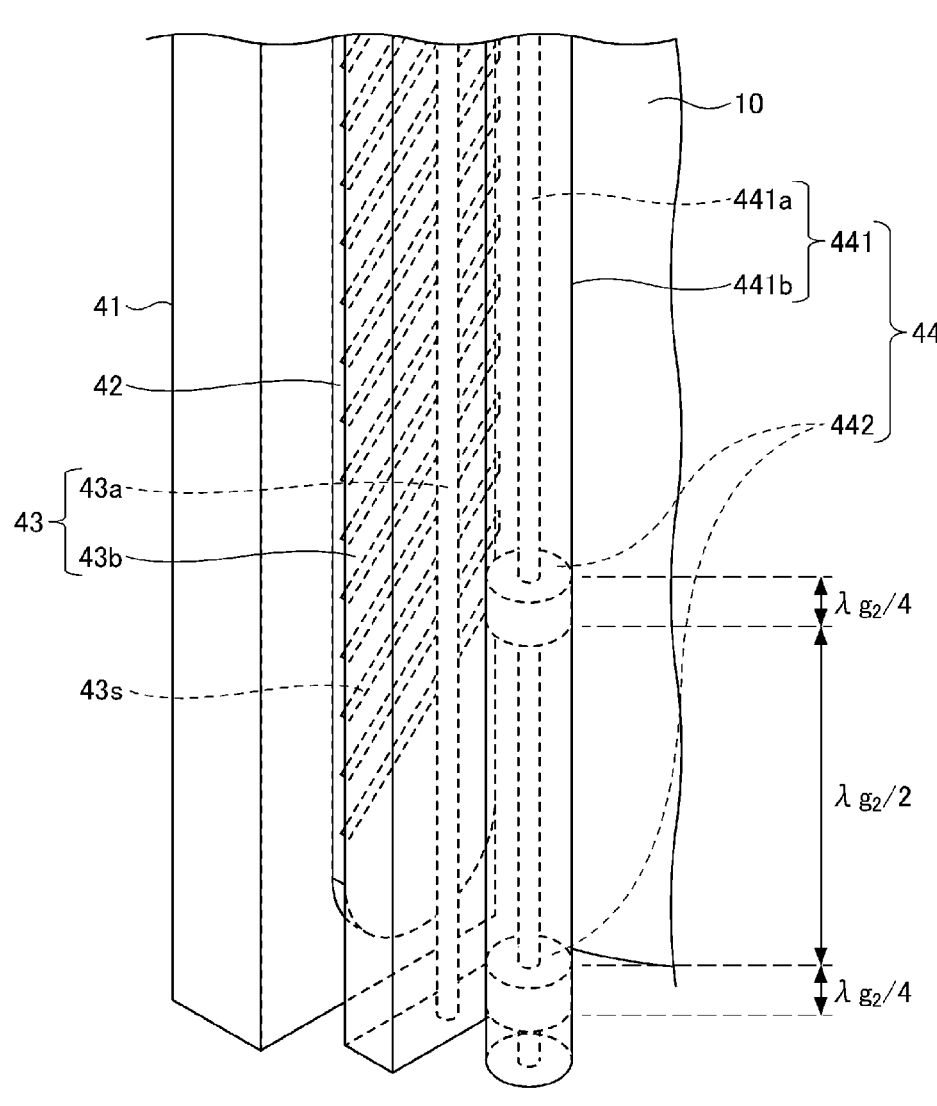
FIG. 6 is a perspective view illustrating a phase controller.

An example of a semiconductor manufacturing apparatus of an embodiment will be described with reference to FIGS. 1 to 6. FIG. 1 is a perspective view illustrating the example of the semiconductor manufacturing apparatus according to the embodiment. FIG. 2 is a vertical cross-sectional view illustrating the example of the semiconductor manufacturing apparatus according to the embodiment. FIG. 3 is a cross-sectional view illustrating the example of the semiconductor manufacturing apparatus, viewed in an arrow direction of A-A line in FIG. 2. FIG. 4 is a vertical cross-sectional view illustrating an example of a microwave introducing unit, viewed in an arrow direction of B-B line in FIG. 3. FIG. 5 is a perspective view illustrating slots. FIG. 6 is a perspective view illustrating a phase controller, which is an enlarged view illustrating a part of the microwave introducing unit.

A semiconductor manufacturing apparatus 1 of the embodiment is a batch-type apparatus that performs a processing on a plurality of substrates W at once. The semiconductor manufacturing apparatus 1 includes a processing container 10, a gas supply unit 30, a microwave introducing unit 40, an exhaust unit 50, a heating unit 60, and a control unit 90.

The processing container 10 has a cylindrical shape having a ceiling and an open lower end, with the vertical direction as the longitudinal direction. The processing container 10 includes a substrate holder 14 (to be described later). The processing container 10 is made of, for example, quartz. A ceiling plate 11 is provided in the vicinity of the upper end inside the processing container 10. A lower side area of the ceiling plate 11 is sealed. The ceiling 11 is made of, for example, quartz. A manifold 12 made of metal and molded in a cylindrical shape is connected to the opening at the lower end of the processing container 10 via a sealing member 13 such as an O-ring.

The manifold 12 supports the lower end of the processing container 10. The substrate holder 14 is inserted into the processing container 10 from below the manifold 12.

The substrate holder 14 substantially horizontally holds a plurality (e.g., 25 to 150) of substrates W at a predetermined interval in the vertical direction. That is, the substrate holder 14 holds a plurality of substrates W in a shelf shape. The substrate W is, for example, a semiconductor wafer. The substrate holder 14 is made of, for example, quartz. The substrate holder 14 includes three columns 15. The substrate holder 14 supports a plurality of substrates W by grooves (not illustrated) formed in the columns 15. The substrate holder 14 is disposed on a table 17 via a heat insulating cylinder 16 made of quartz. The heat insulating cylinder 16 suppresses a temperature drop in the processing container 10 due to heat radiation from the lower side of the processing container 10. The table 17 is supported on a rotary shaft 18. The rotary shaft 18 penetrates through a lid 19 that opens/closes the opening at the lower end of the manifold 12 and made of metal (e.g., stainless steel).

A magnetic fluid seal 20 is provided at the penetrating portion of the rotary shaft 18. The magnetic fluid seal 20 air-tightly seals the rotary shaft 18 and rotatably supports the rotary shaft 18. A seal member 21 such as an O-ring is provided between the peripheral portion of the lid 19 and the lower end of the manifold 12 to maintain the airtightness inside the processing container 10. The rotary shaft 18 is attached to a tip end of an arm 22 supported by, for example, a lifting mechanism (not illustrated) such as a boat elevator. When the arm 22 is moved upward and downward, the substrate holder 14 and the lid 19 are integrally moved upward and downward to be inserted into and removed from the processing container 10.

The gas supply unit 30 includes gas nozzles 31 to 33. The gas nozzles 31 to 33 are made of, for example, quartz.

The gas nozzle 31 inwardly penetrates through the side wall of the manifold 12, is bent upwardly, and extends vertically. A base end of the gas nozzle 31 is positioned outside the processing container 10, and is connected to a gas source GS1 via a gas pipe GP1. A flow rate controller MFC1 and an opening/closing valve V1 are interposed in the gas pipe GP1. The vertical portion of the gas nozzle 31 is positioned inside the processing container 10. In the vertical portion of the gas nozzle 31, a plurality of gas holes 31h is formed at a predetermined interval over the vertical length of the gas nozzle 31 corresponding to the substrate supporting range of the substrate holder 14. The gas nozzle 31 horizontally ejects a first processing gas introduced from the gas source GS1 via the gas pipe GP1 into the processing container 10 from a plurality of gas holes 31h. The first processing gas is a raw material gas such as a silicon-containing gas or a metal-containing gas.

The gas nozzle 32 inwardly penetrates through the side wall of the manifold 12, is bent upwardly, and extends vertically. A base end of the gas nozzle 32 is positioned outside the processing container 10, and is connected to a gas source GS2 via a gas pipe GP2. A flow rate controller MFC2 and an opening/closing valve V2 are interposed in the gas pipe GP2. The vertical portion of the gas nozzle 32 is positioned in a plasma generation space P (to be described later). In the vertical portion of the gas nozzle 32, a plurality of gas holes 32h is formed at a predetermined interval over the vertical length of the gas nozzle 32 corresponding to the substrate supporting range of the substrate holder 14. The gas nozzle 32 horizontally ejects a second processing gas introduced from the gas source GS2 via the gas pipe GP2 into the plasma generation space P from a plurality of gas holes 32h. The second processing gas is, for example, an oxidizing gas or a nitride gas.

The gas nozzle 33 inwardly penetrates through the side wall of the manifold 12 and extends vertically. A base end of the gas nozzle 33 is positioned outside the processing container 10, and is connected to a gas source GS3 via a gas pipe GP3. A flow rate controller MFC3 and an opening/closing valve V3 are interposed in the gas pipe GP3. A tip end of the gas nozzle 33 is positioned inside the processing container 10 and is opened. The gas nozzle 33 horizontally ejects a third processing gas introduced from the gas source GS3 via the gas pipe GP3 into the processing container 10 from the opened portion of the tip end. The third processing gas is, for example, an inert gas such as an argon gas or a nitrogen gas.

The case where the gas supply unit 30 includes three gas nozzles 31 to 33 has been described, but the number of the gas nozzle is not limited. For example, the number of the gas nozzles may be one or two, or four or more. Further, the type of the gas supplied from each of the gas nozzles 31 to 33 is not limited to the illustrated gases.

The microwave introducing unit 40 is provided on a part of the side wall of the processing container 10. By introducing microwaves into the plasma generation space P (to be described later), the microwave introducing unit 40 generates a surface wave plasma from the second processing gas ejected from the gas nozzle 32 in the plasma generation space P. A reaction species such as a radical in the surface wave plasma generated in the plasma generation space P is supplied into the processing container 10. The microwave introducing unit 40 includes a plasma partition wall 41, a transmissive plate 42, a rectangular waveguide 43, a phase controller 44, and a microwave generation device 45.

The plasma partition wall 41 is air-tightly welded to the outer wall of the processing container 10. The plasma partition wall 41 has a concave cross section, and is provided to cover an opening 10a formed on the side wall of the processing container 10. The opening 10a is formed elongated vertically to cover all of the substrates W supported by the substrate holder 14 in the vertical direction. The plasma partition wall 41 forms a space (hereinafter, referred to as "plasma generation space P") that communicates with the inside of the processing container 10. The plasma partition wall 41 supplies the reaction species such as a radical from the plasma generation space P into the processing container 10. The gas nozzle 32 is disposed in the plasma generation space P. An introduction port 41a is formed on one side surface of the plasma partition wall 41. Similarly to the opening 10a, the introduction port 41a is formed elongated vertically to cover all of the substrates W supported by the substrate holder 14 in the vertical direction. The plasma partition wall 41 is made of, for example, a metal material such as aluminum, stainless steel, or Inconel (registered trademark).

The transmissive plate 42 has a size slightly larger than the introduction port 41a. The transmissive plate 42 is attached to one side surface of the plasma partition wall 41 so as to block the introduction port 41a. The plasma partition wall 41 and the transmissive plate 42 are air-tightly sealed by a seal member (not illustrated) such as an O-ring. Therefore, the plasma generation space P is air-tightly maintained. The transmissive plate 42 is made of a material that transmits microwaves, for example, a dielectric material such as $Al_2O_3$, AlN, or quartz.

The rectangular waveguide 43 is provided on one side surface of the plasma partition wall 41 with the transmissive plate 42 therebetween. The rectangular waveguide 43 extends in the vertical direction. That is, a tube axis of the rectangular waveguide 43 is parallel with the vertical direction. The rectangular waveguide 43 is connected to the microwave generation device 45 at the lower end (starting end) thereof, and is connected to the phase controller 44 at the upper end (terminating end) thereof. The rectangular waveguide 43 may be a rectangular waveguide provided with an inner shaft including a first inner conductor 43a and a first outer conductor 43b provided around the first inner conductor 43a. There is no cutoff (block) frequency in the rectangular waveguide provided with the inner shaft, and thus, the dimension of the waveguide may be reduced. The rectangular waveguide 43 is made of, for example, a metal material such as aluminum, stainless steel, or Inconel (registered trademark). The rectangular waveguide 43 includes a plurality of rectangular slots 43s that radiates microwaves.

A plurality of slots 43s is formed to penetrate through the wall of the rectangular waveguide 43 on the transmissive plate 42 side. A length L1 of each slot 43s may be a half of the wavelength ($\lambda g_1$) of microwaves in the rectangular waveguide 43, that is, $\lambda g_1/2$. Therefore, it is possible to efficiently radiate microwaves from the inside of the rectangular waveguide 43 to the plasma generation space P. Each slot 43s may be inclined by a predetermined angle θ toward a tube axial direction with respect to the horizontal direction. Therefore, the length L1 of each slot 43s may be set to be $\lambda g_1/2$, or close to $\lambda g_1/2$, and the horizontal length of the wall of the rectangular waveguide 43 on the transmissive plate 42 side may be shortened. The predetermined angle θ may be, for example, 45°. A width L2 of each slot 43s is determined depending on the wavelength of microwaves in the rectangular waveguide 43 and the material used to form the transmissive plate 42. The width L2 of each slot 43s may be smaller than $\lambda g_1/2$, for example, 10 mm. An arrangement interval L3 of the slots 43s may be smaller than $\lambda g_1/2$, for example, equal to the width L2 of the slot 43s. By setting the arrangement interval L3 of the slots 43s to be smaller than $\lambda g_1/2$, it is possible to increase the positions of peaks and valleys of the electric field strength in the surface wave plasma generated in the plasma generation space P.

The phase controller 44 controls the phase of microwaves propagating in the rectangular waveguide 43. The phase controller 44 includes a coaxial waveguide 441 and a pair of dielectric members 442.

The coaxial waveguide 441 is connected to the upper end of the rectangular waveguide 43. The coaxial waveguide 441 is bent downward from the upper end of the rectangular waveguide 43 and vertically extends. The vertical portion of the coaxial waveguide 441 is parallel with, for example, the rectangular waveguide 43, and the length thereof is substantially equal to, for example, the length of the rectangular waveguide 43. The coaxial waveguide 441 may include a second inner conductor 441a and a second outer conductor 441b provided around the second inner conductor 441a. There is no cutoff (block) frequency in the axial waveguide, and thus, the dimension of the waveguide may be reduced. For example, the second inner conductor 441a and the second outer conductor 441b are disposed concentrically. The second inner conductor 441a is connected to the first inner conductor 43a, and the second outer conductor 441b is connected to the first outer conductor 43b.

The pair of dielectric members 442 are provided in the coaxial waveguide 441 with an interval of $\lambda g_2/2$ in the vertical direction. The $\lambda g_2/2$ is a wavelength of microwaves in the coaxial waveguide 441. The pair of dielectric members 442 are configured to be movable in the vertical direction while maintaining the interval of $\lambda g_2/2$. The pair of dielectric members 442 are configured to reciprocate, for example, a distance of $\lambda g_2/2 \times n$ (n: natural number). Each dielectric member 442 has an annular plate shape having the vertical direction as the axial direction. Each dielectric member 442 has, for example, an axial length (thickness) of $\lambda g_2/4$, an inner diameter substantially equal to an outer diameter of the second inner conductor 441a, and an outer diameter substantially equal to an inner diameter of the second outer conductor 441b. Each dielectric member 442 is made of, for example, a dielectric material such as $Al_2O_3$ or AlN.

The microwave generation device 45 generates microwaves. The microwave generation device 45 supplies the generated microwaves to the rectangular waveguide 43. The frequency of the microwaves may be 1 GHz or less from the viewpoint of suppressing the attenuation of the microwaves in the rectangular waveguide 43. The frequency of the microwaves may be 800 MHz or more from the viewpoint of shortening the length of the slot 43s and miniaturizing the waveguide or peripheral components.

The microwave introducing unit 40 transfers the microwaves generated by the microwave generation device 45 to the rectangular waveguide 43, and controls the phase by the phase controller 44, and introduces to the plasma generation space P via a plurality of slots 43s and the transmissive plate 42.

The exhaust unit 50 includes an exhaust port 51, a cover member 52, an exhaust pipe 53, a pressure control valve 54, and an exhaust device 55. The exhaust port 51 is provided in a side wall portion of the processing container 10 facing the opening 10a. The exhaust port 51 is formed elongated vertically corresponding to the substrate holder 14. The cover member 52 is attached to a portion corresponding to the exhaust port 5 of the processing container 10 to cover the exhaust port 51. The cover member 52 has a U-shaped cross section, and extends in the vertical direction along the side wall of the processing container 10. The exhaust pipe 53 is connected to the lower portion of the cover member 52. The pressure control valve 54 is interposed in the exhaust pipe 53. The pressure control valve 54 controls the pressure inside the processing container 10. The exhaust device 55 is interposed in the exhaust pipe 53. The exhaust device 55 includes, for example, a vacuum pump. The exhaust unit 50 exhausts the inside of the processing container 10 by the exhaust device 55 via the exhaust port 51 and the exhaust pipe 53.

The heating unit 60 has a cylindrical shape, and is provided around the processing container 10. The heating unit 60 includes, for example, a heater and an insulating member. The heating unit 60 heats the substrate W in the processing container 10 by the heater.

The control unit 90 controls each unit of the semiconductor manufacturing apparatus 1. For example, the control unit 90 controls the gas supply unit 30 and the microwave introducing unit 40 so as to generate a surface wave plasma from the second processing gas ejected from the gas nozzle 32, by introducing microwaves to the plasma generation space P while moving the pair of dielectric members 442. Therefore, the phase of the reflected wave with respect to the incident wave of the microwave in the rectangular waveguide 43 is shifted over time, and thus, the positions of the antinodes and nodes of the standing wave of the microwave in the rectangular waveguide 43 are changed over time. As a result, the positions of peaks and valleys of the electric field strength along the vertical direction in the surface wave plasma generated in the plasma generation space P are changed over time, and thus, it is possible to improve the uniformity of the time average distribution of the electric field strength along the vertical direction in the surface wave plasma.

The control unit 90 may be, for example, a computer. A computer program that controls an operation of each unit of the semiconductor manufacturing apparatus 1 is stored in a storage medium. The storage medium may be, for example, a flexible disk, a compact disk, a hard disk, a flash memory, and a DVD.

[Manufacturing Method for Semiconductor Device]

An example of a manufacturing method for a semiconductor device performed by the semiconductor manufacturing apparatus 1 will be described. Hereinafter, descriptions will be made on, as an example, a case where a silicon nitride film is formed by an atomic layer deposition (ALD) method using a silicon-containing gas as a first processing gas, a nitride gas as a second processing gas, and a nitrogen gas as a third processing gas.

First, the inside of the processing container 10 is adjusted to a predetermined temperature, and the substrate holder 14 in which a plurality of substrates W is mounted is carried into the processing container 10. Subsequently, the inside of the processing container 10 is adjusted to a predetermined pressure while exhausting the inside of the processing container 10 by the exhaust device 55.

Subsequently, an adsorption processing, a first purge processing, a nitriding processing, and a second purge processing are repeated a predetermined number of times to form a silicon nitride film having a predetermined film thickness.

In the adsorption processing, a silicon-containing gas is supplied from the gas nozzle 31 into the processing container 10. Therefore, the silicon-containing gas is adsorbed on the surface of the substrate W.

In the first purge processing, a nitrogen gas is supplied from the gas nozzle 33 into the processing container 10 while exhausting inside the processing container 10 by the exhaust device 55. Therefore, the silicon-containing gas remaining in the processing container 10 is discharged, and the atmosphere in the processing container 10 is replaced with the nitrogen gas.

In the nitriding processing, a nitriding gas is supplied from the gas nozzle 32 to the plasma generation space P, and microwaves are introduced into the plasma generation space P by the microwave introducing unit 40. Therefore, a surface wave plasma is generated from the nitriding gas in the plasma generation space P, and a reaction species such as a radical in the surface wave plasma is supplied into the processing container 10. At this time, the pair of dielectric members 442 are reciprocated for the distance of $\lambda g_2/2 \times n$ (n: natural number) while maintaining the interval of $\lambda g_2/2$, so that the phase of the microwaves propagating in the rectangular waveguide 43 is controlled. Therefore, the phase of the reflected wave with respect to the incident wave of the microwave in the rectangular waveguide 43 is shifted over time, and thus, the positions of the antinodes and nodes of the standing wave of the microwave in the rectangular waveguide 43 are changed over time. As a result, the positions of peaks and valleys of the electric field strength along the vertical direction in the surface wave plasma generated in the plasma generation space P are changed over time, and thus, it is possible to improve the uniformity of the time average distribution of the electric field strength along the vertical direction in the surface wave plasma.

In the second purge processing, a nitrogen gas is supplied from the gas nozzle 33 into the processing container 10 while exhausting inside the processing container 10 by the exhaust device 55. Therefore, the nitriding gas remaining in the processing container 10 is discharged, and the atmosphere in the processing container 10 is replaced with the nitrogen gas.

Subsequently, the substrate holder 14 in which a plurality of substrates W on which the silicon nitride film is formed is mounted is carried out from the inside of the processing container 10, and the processing is ended.

In the embodiment described above, the case where the silicon nitride film is formed by the ALD method is described, but the present disclosure is not limited thereto. For example, the silicon nitride film may be formed by a chemical vapor deposition (CVD) method. For example, a silicon oxide film, a metal nitride film, or a metal oxide film may be formed instead of the silicon nitride film.

[Effects]

According to the embodiment, the second processing gas is supplied to and microwaves are introduced to the plasma generation space P to generate the surface wave plasma from the second processing gas in the plasma generation space P. As a result, there is little exudation of the portion having high electric field strength in the plasma from the plasma generation space P into the processing container 10, which causes a problem in a plasma such as an inductively coupled plasma (ICP), and thus, a reaction species such as a radical having a low energy may be supplied into the processing container 10. Further, microwaves have high production efficiency of a reactive species such as a radical, and thus, productivity is improved.

Further, according to the embodiment, a surface wave plasma is generated from the second processing gas ejected from the gas nozzle 32, by introducing microwaves to the plasma generation space P while moving the pair of dielectric members 442. Therefore, the phase of the reflected wave with respect to the incident wave of the microwave in the rectangular waveguide 43 is shifted over time, and thus, the positions of the antinodes and nodes of the standing wave of the microwave in the rectangular waveguide 43 are changed over time. As a result, the positions of peaks and valleys of the electric field strength along the vertical direction in the surface wave plasma generated in the plasma generation space P are changed over time, and thus, it is possible to improve the uniformity of the time average distribution of the electric field strength along the vertical direction in the surface wave plasma.

[Analysis Result]

At first, the effect of controlling the phase of the microwaves propagating in the rectangular waveguide 43 when the surface wave plasma is generated in the plasma generation space P of the semiconductor manufacturing apparatus 1 that affects the distribution of the electric field strength in the surface wave plasma is verified by analysis. In the analysis, with respect to a case where an argon gas is supplied from the gas nozzle 32 to the plasma generation space P, and the pair of dielectric members 442 are reciprocated for the distance of $\lambda g_2/2 \times n$ (n: natural number) while maintaining the interval of $\lambda g_2/2$, the distribution of the electric field strength in the vertical direction is calculated (Example). Further, for comparison, with respect to a case where an argon gas is supplied from the gas nozzle 32 to the plasma generation space P, and the pair of dielectric members 442 are fixed without moving, the distribution of the electric field strength in the vertical direction is calculated (Comparative Example).

Figure 7:
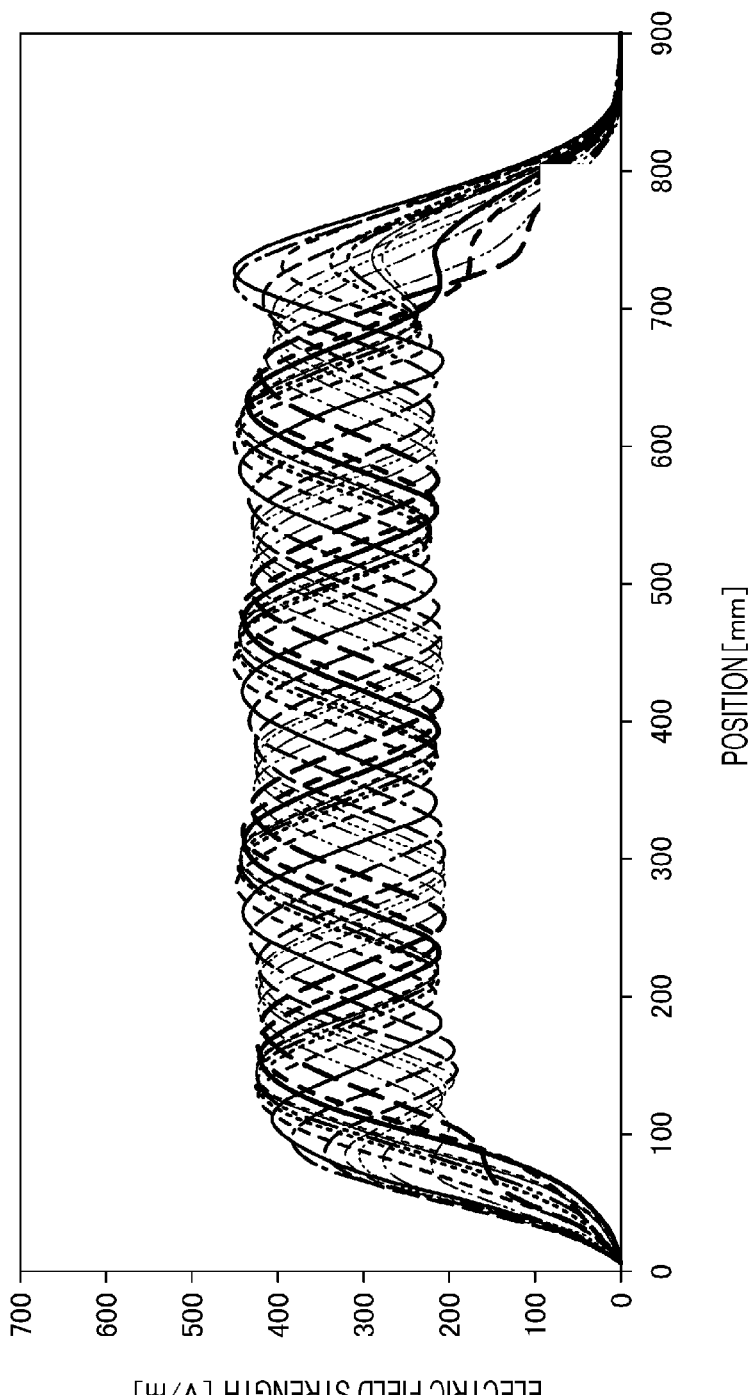
FIG. 7 is a view (1) illustrating analysis results of an electric field strength distribution in a surface wave plasma of an example.

FIG. 7 is a view illustrating analysis results of the electric field strength distribution in the surface wave plasma of Example, which illustrates the electric field strength distribution in the surface wave plasma at a plurality of timings where the positions of the pair of dielectric members 442 are different from each other. In FIG. 7, the horizontal axis indicates the position [mm] in the vertical direction, and 0 mm is the upper end of the plasma partition wall 41, and 900 mm is the lower end of the plasma partition wall 41. In FIG.

7, the vertical axis indicates the electric field strength [V/m]. In FIG. 7, the electric field strength in the surface wave plasma in the case where the positions of the pair of dielectric members 442 are different from each other is illustrated by different line types.

As illustrated in FIG. 7, when the pair of dielectric members 442 are reciprocated the distance of $\lambda g_2/2 \times n$ (n: natural number) while maintaining the interval of $\lambda g_2/2$, it can be seen that the positions of peaks and valleys of the electric field strength along the vertical direction in the surface wave plasma generated in the plasma generation space P are changed.

Figure 8:
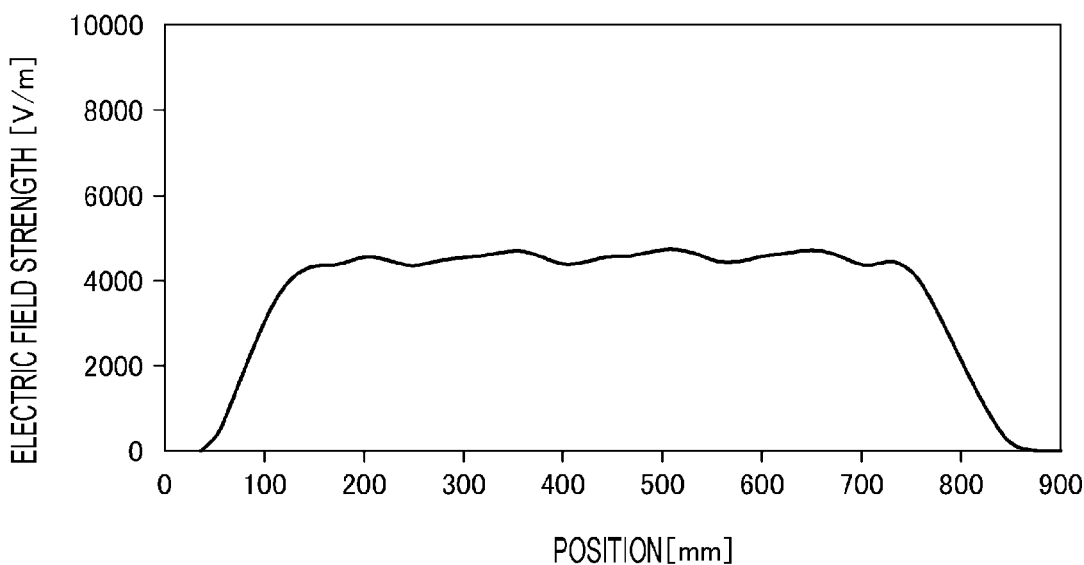
FIG. 8 is a view (2) illustrating an analysis result of an electric field strength distribution in a surface wave plasma of an example.

FIG. 8 is a view illustrating analysis results of the electric field strength distribution in the surface wave plasma of Example, which illustrates the result of integrating the spectra of the plurality of electric field strengths illustrated in FIG. 7. In FIG. 8, the horizontal axis indicates the position [mm] in the vertical direction, and 0 mm is the upper end of the plasma partition wall 41, and 900 mm is the lower end of the plasma partition wall 41. In FIG. 8, the vertical axis indicates the electric field strength [V/m].

As illustrated in FIG. 8, it can be seen that the integrated value of the electric field strength is substantially constant in the range of the position between 150 mm and 750 mm. It is considered that, as illustrated in FIG. 7, this is because the positions of peaks and valleys of the electric field strength along the vertical direction in the surface wave plasma generated in the plasma generation space P are changed over time.

Figure 9:
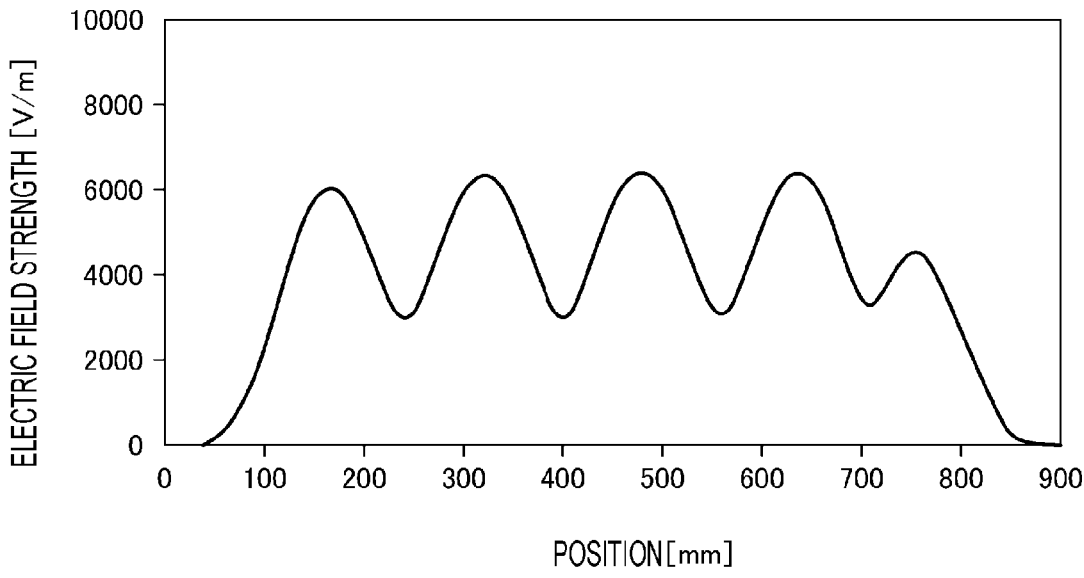
FIG. 9 is a view illustrating an analysis result of an electric field strength distribution in a surface wave plasma of a comparative example.

FIG. 9 is a view illustrating analysis results of the electric field strength distribution in the surface wave plasma of Comparative Example, which illustrates the result of integrating the spectra of the plurality of electric field strengths in the surface wave plasma at a plurality of timings while the positions of the pair of dielectric members 442 are fixed. In FIG. 9, the horizontal axis indicates the position [mm] in the vertical direction, and 0 mm is the upper end of the plasma partition wall 41, and 900 mm is the lower end of the plasma partition wall 41. In FIG. 9, the vertical axis indicates the electric field strength [V/m].

As illustrated in FIG. 9, it can be seen that the integrated value of the electric field strength is changed in a wavy manner in the range of the position between 150 mm and 750 mm. It is considered that this is because the positions of peaks and valleys of the electric field strength along the vertical direction in the surface wave plasma generated in the plasma generation space P are not changed over time.

Next, the effect of controlling the phase of the microwaves propagating in the rectangular waveguide 43 when the surface wave plasma is generated in the plasma generation space P of the semiconductor manufacturing apparatus 1 that affects the power absorption efficiency to the surface wave plasma is verified by analysis. In the analysis, with respect to a case where an argon gas is supplied from the gas nozzle 32 to the plasma generation space P, and the pair of dielectric members 442 are reciprocated for the distance of $\lambda g_2/2 \times n$ (n: natural number) while maintaining the interval of $\lambda g_2/2$, the reflection ratio of the microwaves at the inlet of the rectangular waveguide 43 is calculated.

According to the analysis result, it may be confirmed that the reflection ratio of the microwaves at the inlet of the rectangular waveguide 43 when the pair of dielectric members 442 are reciprocated for the distance of $\lambda g_2/2 \times n$ (n: natural number) while maintaining the interval of $\lambda g_2/2$ is substantially stable at approximately 0.6. From the result, even when the pair of dielectric members 442 are reciprocated for the distance of $\lambda g_2/2 \times n$ (n: natural number) while maintaining the interval of $\lambda g_2/2$, it is shown that the power absorption efficiency to the surface wave plasma is not substantially affected.

According to the present disclosure, it is possible to improve the uniformity of the electric field strength in the plasma.

From the foregoing, it will be appreciated that various embodiments of the present disclosure have been described herein for purposes of illustration, and that various Modifications may be made without departing from the scope and spirit of the present disclosure. Accordingly, the various embodiments disclosed herein are not intended to be limiting, with the true scope and spirit being indicated by the following claims.

What is claimed is:

1. A semiconductor manufacturing apparatus comprising:
   a processing container configured to accommodate a substrate holder that holds a plurality of substrates in a shelf shape;
   a gas supply configured to supply a processing gas into the processing container; and
   a microwave introducer configured to generate a plasma from the processing gas,
   wherein the microwave introducer includes:
   a rectangular waveguide provided along a length direction of the processing container and including a plurality of slots that radiates microwaves;
   a microwave generator connected to one end of the rectangular waveguide and configured to supply the microwaves to the rectangular waveguide; and
   a phase controller connected to another end of the rectangular waveguide, bent from the another end of the rectangular waveguide, extending along the length direction of the processing container in parallel with the rectangular waveguide, and configured to control a phase of the microwaves propagating in the rectangular waveguide.

2. The semiconductor manufacturing apparatus according to claim 1, wherein the phase controller includes:
   a coaxial waveguide connected to the another end of the rectangular waveguide; and
   a pair of dielectrics provided in the coaxial waveguide at an interval of $\lambda g_2/2$ (where $\lambda g_2$ represents a wavelength of microwaves in the coaxial waveguide) in an axial direction of a tube of the coaxial waveguide, and configured to be movable in the axial direction of the tube.

3. The semiconductor manufacturing apparatus according to claim 2, wherein each of the pair of dielectrics has an annular plate shape having the axial direction of the tube as an axial direction and a thickness of $\lambda g_2/4$.

4. The semiconductor manufacturing apparatus according to claim 2, wherein the pair of dielectrics are configured to reciprocate a distance of $\lambda g_2/2 \times n$ (where n represents a natural number) along the axial direction of the tube while maintaining the interval of $\lambda g_2/2$.

5. The semiconductor manufacturing apparatus according to claim 2, further comprising:
   a controller configured to control the gas supply and the microwave introducer to introduce the microwaves while moving the pair of dielectrics, thereby generating the plasma from the processing gas.

6. The semiconductor manufacturing apparatus according to claim 1, wherein the rectangular waveguide includes an inner shaft.

7. The semiconductor manufacturing apparatus according to claim 1, wherein each of the plurality of slots is inclined toward the axial direction of the tube of the rectangular waveguide with respect to a horizontal direction.

8. The semiconductor manufacturing apparatus according to claim 1, wherein an opening is formed in a side wall of the processing container, and the microwave introducer includes:

a plasma partition wall configured to cover the opening and including an introduction port that introduces microwaves radiated from the plurality of slots into the plasma partition wall; and a transmissive plate provided between the rectangular waveguide and the plasma partition wall and configured to transmit the microwaves.

9. The semiconductor manufacturing apparatus according to claim 8, wherein the gas supply includes a gas nozzle provided in the plasma partition wall.

10. A method for manufacturing a semiconductor device, the method comprising:

accommodating a substrate holder that holds a plurality of substrates in a shelf shape in a processing container;

supplying a processing gas into the processing container; and generating a plasma from the processing gas by introducing microwaves from a microwave generator into the processing container, wherein the generating the plasma includes controlling a phase of the microwaves propagating in a rectangular waveguide having one end connected to the microwave generator by a phase controller connected to another end of the rectangular waveguide provided along a length direction of the processing container and including a plurality of slots that radiates the microwaves, and the phase controller is bent from the another end of the rectangular waveguide and extends along the length direction of the processing container in parallel with the rectangular waveguide.

11. The semiconductor manufacturing apparatus according to claim 1, wherein a length of each of the plurality of slots is $\lambda g_2/2$.

12. The semiconductor manufacturing apparatus according to claim 1, wherein a width of each of the plurality of slots is smaller than $\lambda g_2/2$.

13. The semiconductor manufacturing apparatus according to claim 1, wherein an arrangement interval of the plurality of slots is smaller than $\lambda g_2/2$.

14. The semiconductor manufacturing apparatus according to claim 1, wherein the microwaves have a frequency equal to or greater than 800 MHz and equal to or less than 1 GHz.

* * * * *